(12) United States Patent
Kim

(10) Patent No.: US 10,319,945 B2
(45) Date of Patent: Jun. 11, 2019

(54) DISPLAY DEVICE PROVIDING LIGHT EMISSION ON BEZEL REGION AND MANUFACTURING METHOD THEREOF

(71) Applicant: Samsung Display Co., Ltd., Yongin-si (KR)

(72) Inventor: Mu Gyeom Kim, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/933,293

(22) Filed: Nov. 5, 2015

(65) Prior Publication Data

US 2016/0315283 A1    Oct. 27, 2016

(30) Foreign Application Priority Data

Apr. 24, 2015 (KR) ........................ 10-2015-0058111

(51) Int. Cl.
| | |
|---|---|
| *H01L 27/32* | (2006.01) |
| *H01L 51/52* | (2006.01) |
| *H01L 51/56* | (2006.01) |
| *H01L 29/08* | (2006.01) |
| *H01L 35/24* | (2006.01) |
| *H01L 51/00* | (2006.01) |

(52) U.S. Cl.
CPC ...... *H01L 51/5256* (2013.01); *H01L 27/3246* (2013.01); *H01L 27/3267* (2013.01); *H01L 27/3293* (2013.01); *H01L 51/5262* (2013.01); *H01L 51/56* (2013.01); *H01L 27/3244* (2013.01)

(58) Field of Classification Search
CPC ............. H01L 27/3267; H01L 27/3244; H01L 27/3293; H01L 2251/5315; H01L 2251/533; H01L 51/5256; H01L 27/3246; H01L 2251/5323; H01L 51/5262; H01L 51/56
USPC ........... 257/40, 82, 89, 72; 438/28; 313/504, 313/512
See application file for complete search history.

(56) References Cited

U.S. PATENT DOCUMENTS

| | | | | |
|---|---|---|---|---|
| 3,785,792 | A | * | 1/1974 | Plumat .................... C03C 17/22 65/30.14 |
| 2006/0231842 | A1 | * | 10/2006 | Hirakata ............... H01L 25/048 257/72 |

(Continued)

FOREIGN PATENT DOCUMENTS

| | | |
|---|---|---|
| EP | 2184676 | 5/2010 |
| KR | 1020060017204 | 2/2006 |

(Continued)

OTHER PUBLICATIONS

European Search Report—European Application No. 16153285.8 dated Sep. 28, 2016.

(Continued)

*Primary Examiner* — Nduka E Ojeh
(74) *Attorney, Agent, or Firm* — Cantor Colburn LLP

(57) ABSTRACT

A display device includes a first substrate, a first emission layer disposed on the first substrate and emitted by a top emission type, a second substrate facing the first substrate and covering the first substrate, and a second emission layer disposed under the second substrate and emitted by a bottom emission type, wherein a portion of the first emission layer and a portion of the second emission layer.

17 Claims, 11 Drawing Sheets

(56) References Cited

U.S. PATENT DOCUMENTS

| | | | | |
|---|---|---|---|---|
| 2006/0244374 | A1* | 11/2006 | Kim | H01L 25/048 313/506 |
| 2007/0159070 | A1* | 7/2007 | Hu | H01L 25/048 313/504 |
| 2010/0013384 | A1* | 1/2010 | Song | H01L 51/5246 313/504 |
| 2011/0057861 | A1* | 3/2011 | Cok | H01L 27/3293 345/1.3 |
| 2011/0221789 | A1* | 9/2011 | Ota | H01L 27/3267 345/690 |
| 2012/0119239 | A1* | 5/2012 | Kim | H01L 25/048 257/89 |
| 2012/0313512 | A1* | 12/2012 | Yamada | E06B 9/303 313/504 |
| 2014/0132488 | A1 | 5/2014 | Kim et al. | |
| 2014/0145161 | A1 | 5/2014 | Naijo | |
| 2014/0183491 | A1 | 7/2014 | Shin et al. | |
| 2015/0041766 | A1* | 2/2015 | Naijo | H01L 27/3244 257/40 |
| 2015/0060933 | A1* | 3/2015 | Ohno | H01L 51/5237 257/99 |
| 2016/0145161 | A1* | 5/2016 | Kail | C05C 1/02 71/59 |
| 2016/0254336 | A1* | 9/2016 | Zhang | G02F 1/134309 349/33 |

FOREIGN PATENT DOCUMENTS

| | | |
|---|---|---|
| KR | 1020100051357 | 5/2010 |
| KR | 101098529 | 12/2011 |
| KR | 1020110137089 | 12/2011 |
| KR | 1020120028427 | 3/2012 |
| KR | 1020130086875 | 8/2013 |
| WO | 2014091761 | 6/2014 |

OTHER PUBLICATIONS

Byeong-Soo Bae, "Organicinorganic Hybrid Coating Material", Polymer Science and Technology vol. 12, No. 5, Oct. 2001, pp. 716-723.

* cited by examiner

DISPLAY DEVICE PROVIDING LIGHT EMISSION ON BEZEL REGION AND MANUFACTURING METHOD THEREOF

This application claims priority to Korean Patent Application No. 10-2015-0058111 filed on Apr. 24, 2015, and all the benefits accruing therefrom under 35 U.S.C. § 119, the content of which in its entirety is incorporated herein by reference.

BACKGROUND

1. Field

The invention relates to a display device and a manufacturing method thereof.

2. Description of the Related Art

A display device mainly uses a flat panel display, such as a liquid crystal display, an organic light emitting device, or a plasma display, for example. Particularly, an organic light emitting device includes two electrodes and an organic emission layer interposed therebetween, electrons injected from one electrode and holes injected from the other electrode are combined in the organic emission layer to form excitons, and the excitons release energy to emit light.

The display device includes a light emission region and a bezel region as a non-light emission region surrounding the light emission region. A signal processing circuit to drive the plurality of pixels is positioned in the display area and an edge of an encapsulation layer to protect the plurality of pixels is positioned in the bezel region. Efforts to minimize the bezel region in order to maximize the light emission region are being further researched.

SUMMARY

When bending a window to minimize a bezel region, a dead space is still exists and a reliability of an edge of an encapsulation layer deteriorates.

The invention provides a display device for the removal of a non-light emitting region, along with a manufacturing method thereof.

A display device according to an exemplary embodiment of the invention includes a first substrate, a first emission layer disposed on the first substrate and emitted by a top emission type, a second substrate facing the first substrate and covering the first substrate, and a second emission layer disposed under the second substrate and emitted by a bottom emission type, wherein the portion of the first emission layer and the portion of the second emission layer overlap each other.

In an exemplary embodiment, the first substrate may include a first center portion and a first outer portion enclosing the first center portion, the second substrate may include a second center portion, a second outer portion enclosing the second center portion, and an overlapping portion between the second center portion and the second outer portion, and the second emission layer may be disposed under the second outer portion and the overlapping portion.

In an exemplary embodiment, the first substrate and second substrate may respectively include thin glasses having a thickness of about 50 micrometers (μm) to about 100 μm.

In an exemplary embodiment, the first substrate and the second substrate may be respectively chemical tempered glasses including a potassium factor.

In an exemplary embodiment, the overlapping portion and the first outer portion may overlap each other.

In an exemplary embodiment, the portion of the first emission layer positioned at the first outer portion and the portion of the second emission layer positioned at the overlapping portion may overlap each other.

In an exemplary embodiment, a first encapsulation layer covering the first emission layer, a second encapsulation layer covering the second emission layer and the second substrate, and an adhesive layer adhering the first encapsulation layer and the second encapsulation layer to each other may be further included.

In an exemplary embodiment, the second center portion of the second substrate may contact the second encapsulation layer.

In an exemplary embodiment, the thickness of the adhesive layer positioned in the second center portion of the second substrate may be larger than the thickness of the adhesive layer positioned in the second outer portion and the overlapping portion of the second substrate.

In an exemplary embodiment, the first emission layer may include a plurality of first pixels, the second emission layer may include a plurality of second pixels, and a boundary portion interval serving as an interval between a second outermost pixel, which is the outermost pixel among the plurality of second pixels, and the first pixel closest to the second outermost pixel among the plurality of first pixels on a plane surface may be substantially the same as the center portion interval serving as the interval between the adjacent first pixels among the plurality of first pixels.

In an exemplary embodiment, the first pixel may only be positioned in the first center portion.

In an exemplary embodiment, the first pixel may be positioned at the first center portion and the first outer portion.

In an exemplary embodiment, the first pixel may include a first driving transistor disposed on the first substrate and a first organic light emitting diode connected to the first driving transistor, the second pixel may include a second driving transistor disposed on the second substrate and a second organic light emitting diode connected to the second driving transistor, and the light emitted from the first organic light emitting diode and the second organic light emitting diode may pass through the second substrate to be irradiated.

In an exemplary embodiment, a polarizer disposed on the second substrate may be further included.

In an exemplary embodiment, the polarizer may include a light blocking member that is disposed on the second substrate and has a plurality of light blocking openings, and a color filter disposed in the plurality of light blocking openings.

In an exemplary embodiment, a first hard coating layer disposed on the polarizer may be further included.

In an exemplary embodiment, a touch sensor disposed on the first hard coating layer may be further included.

In an exemplary embodiment, a second hard coating layer disposed on the touch sensor may be further included.

A manufacturing method of a display device according to an exemplary embodiment of the invention includes forming a first emission layer emitting light by a top emission type on a first substrate, forming a first encapsulation layer covering the first emission layer, forming a second emission layer emitting the light by a bottom emission type on the second outer portion and the overlapping portion of the second substrate, covering a second encapsulation layer covering the second emission layer, and turning the second substrate and interposing an adhesive layer between the first encapsulation layer and the second encapsulation layer to adhere the first encapsulation layer and the second encapsulation layer, wherein the portion of the first emission layer and the portion of the second emission layer overlap each other.

In an exemplary embodiment, the method may further include chemically reinforcing the first substrate and the second substrate In an exemplary embodiment, the first substrate and second substrate may include a thin glass having a thickness of about 50 micrometers (μm) to about 100 μm, respectively.

In an exemplary embodiment, the first substrate may include a first center portion and a first outer portion enclosing the first center portion, the second substrate may include a second center portion, a second outer portion enclosing the second center portion, and an overlapping portion between the second center portion and the second outer portion, and the second emission layer may be disposed under the second outer portion and the overlapping portion.

In an exemplary embodiment, the overlapping portion and the first outer portion may overlap each other.

In an exemplary embodiment, the portion of the first emission layer positioned at the first outer portion and the portion of the second emission layer positioned at the overlapping portion may overlap each other.

In an exemplary embodiment, the method may further include forming a polarization layer on the second substrate and forming a first hard coating layer on the polarization layer.

In an exemplary embodiment, the method may further include forming a touch sensor on the first hard coating layer and forming a second hard coating layer on the touch sensor.

According to an exemplary embodiment of the invention, the second center portion of the second substrate is used as a window for the top emission and the second outer portion, and the overlapping portion of the second substrate is simultaneously used as the substrate for the bottom emission, thereby maximizing the emission region.

Also, the portion of the first emission layer of the first substrate and the portion of the second emission layer of the second substrate overlap each other, and the center portion interval between the first pixels or the second pixels and the boundary portion interval between the first pixel and the second pixel are provided to be substantially the same in order to not recognize the boundary portion between the first pixel and the second pixel, such that the first emission layer of the top emission and the second emission layer of the bottom emission may be not distinguished. Accordingly, the display quality may be improved.

Also, the first substrate and the second substrate including thin glass are chemically reinforced, or the first hard coating layer and the second hard coating layer are disposed on the second substrate, thereby simultaneously satisfying the flexibility and the hardness of the display device.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
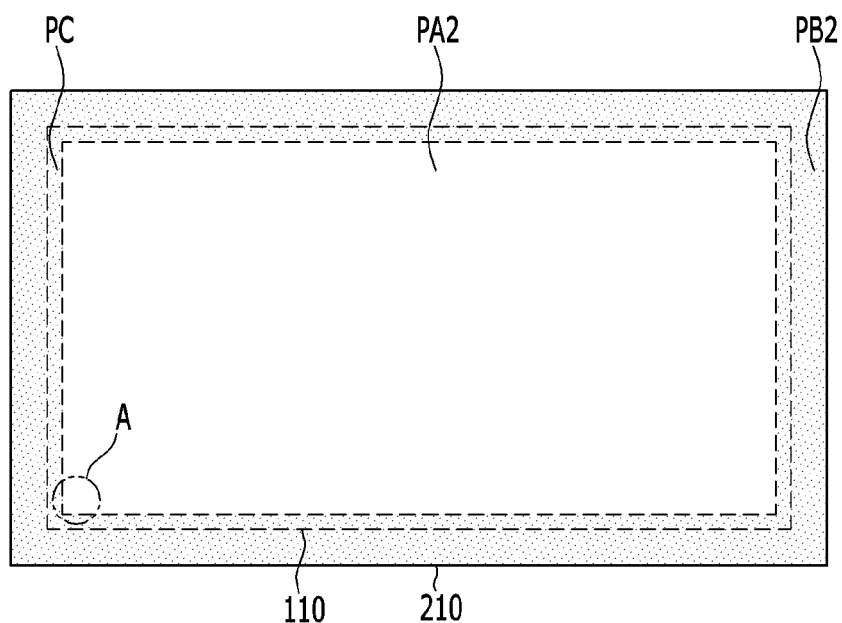
FIG. 1 is a schematic top plan view of a display device according to an exemplary embodiment of the invention.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

The drawings and description are to be regarded as illustrative in nature and not restrictive. Like reference numerals designate like elements throughout the specification.

Further, since sizes and thicknesses of constituent members shown in the accompanying drawings are arbitrarily given for better understanding and ease of description, the invention is not limited thereto. In the drawings, the thickness of layers, films, panels, regions, etc., are exaggerated for clarity. In the drawings, for better understanding and ease of description, the thicknesses of some layers and areas are exaggerated.

In the specification, unless explicitly described to the contrary, the word "comprise" and variations such as "comprises" or "comprising" will be understood to imply the inclusion of stated elements but not the exclusion of any other elements. In addition, it will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" means positioning on or below the object portion, and does not necessarily mean positioning on the upper side of the object portion based on a direction of gravity.

Further, in the specification, the word "on a flat surface" means when an object portion is viewed from above, and the word "on a cross section" means when a cross section taken by vertically cutting an object portion is viewed from the side.

Further, the invention is not limited to the number of thin film transistors TFT and capacitors illustrated in the accompanying drawings, and the organic light emitting diode display may include a plurality of thin film transistors and one or more capacitors in one pixel, and a separate wire may be further provided or a known wire may be omitted to provide various structures. Here, the pixel means a minimum unit displaying an image, and the display device displays an image through a plurality of pixels.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/ or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ± 30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Now, a display device according to an exemplary embodiment of the invention will be described in detail with reference to the accompanying drawings.

Figure 2:
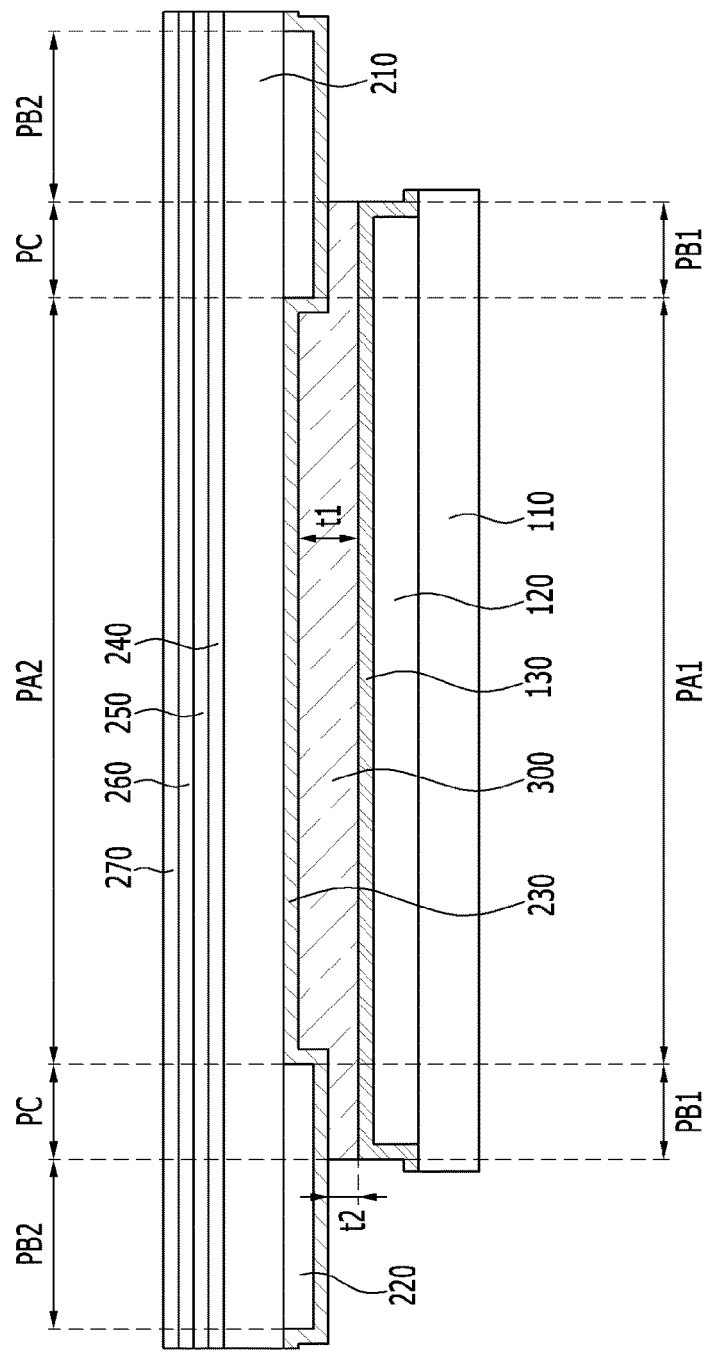
FIG. 2 is a schematic cross-sectional view of a display device according to an exemplary embodiment of the invention.
Figure 3:
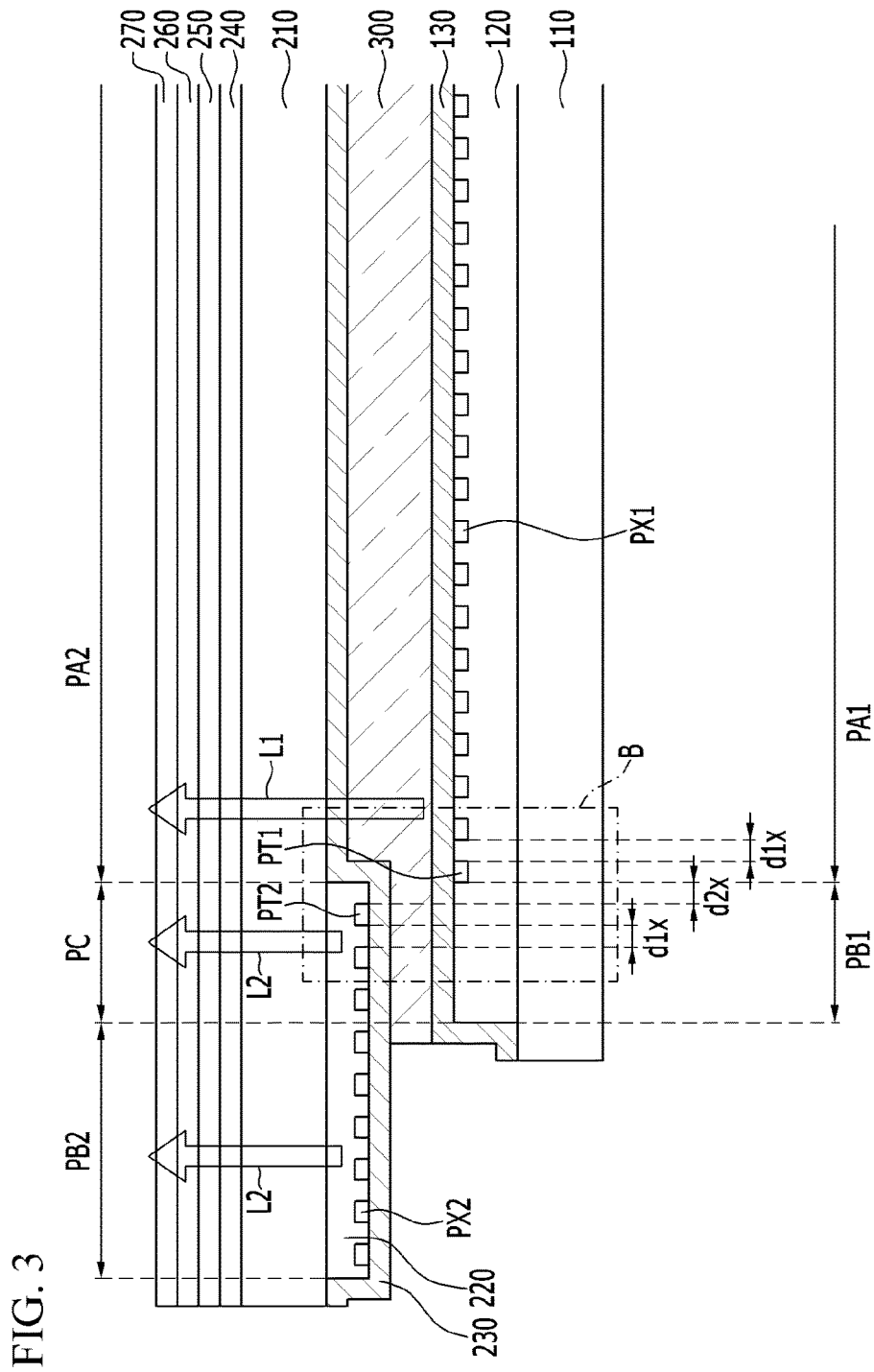
FIG. 3 is an enlarged cross-sectional view of one end portion of FIG. 2.
Figure 4:
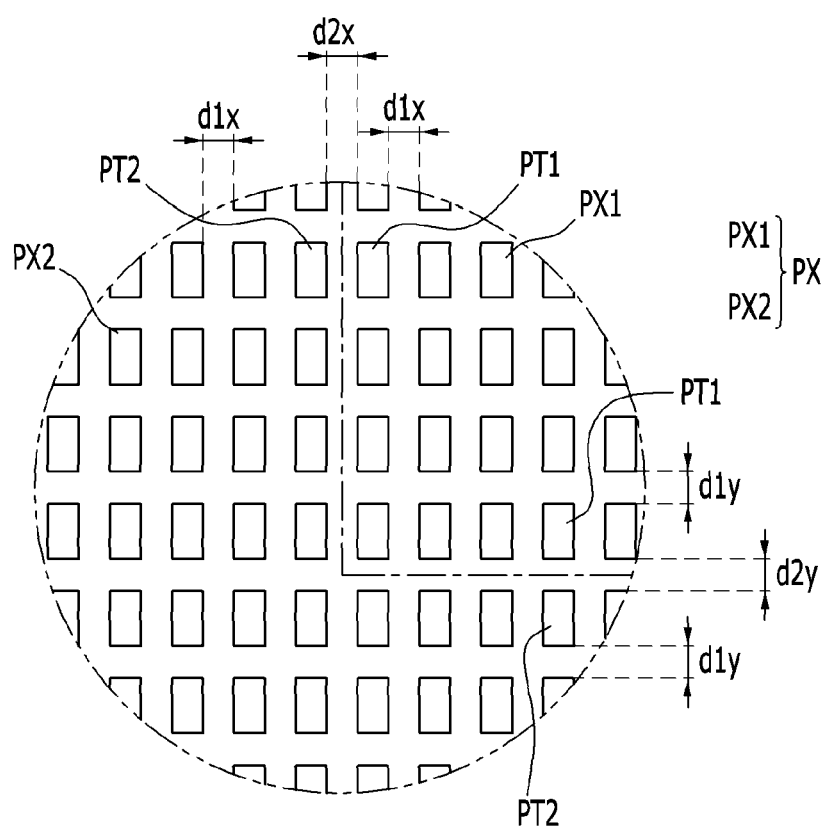
FIG. 4 is an enlarged top plan view of a portion A of FIG. 1.
Figure 5:
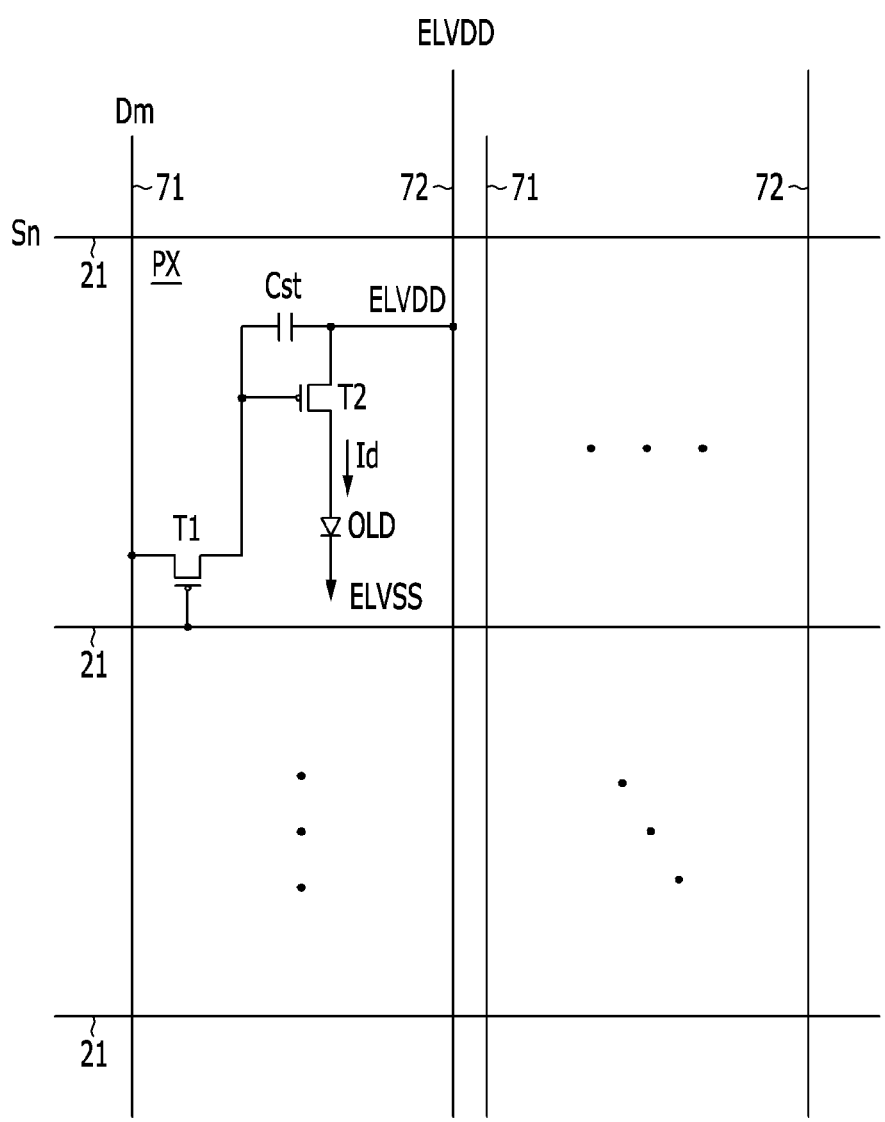
FIG. 5 is an equivalent circuit diagram of one pixel of a display device according to an exemplary embodiment of the invention.
Figure 6:
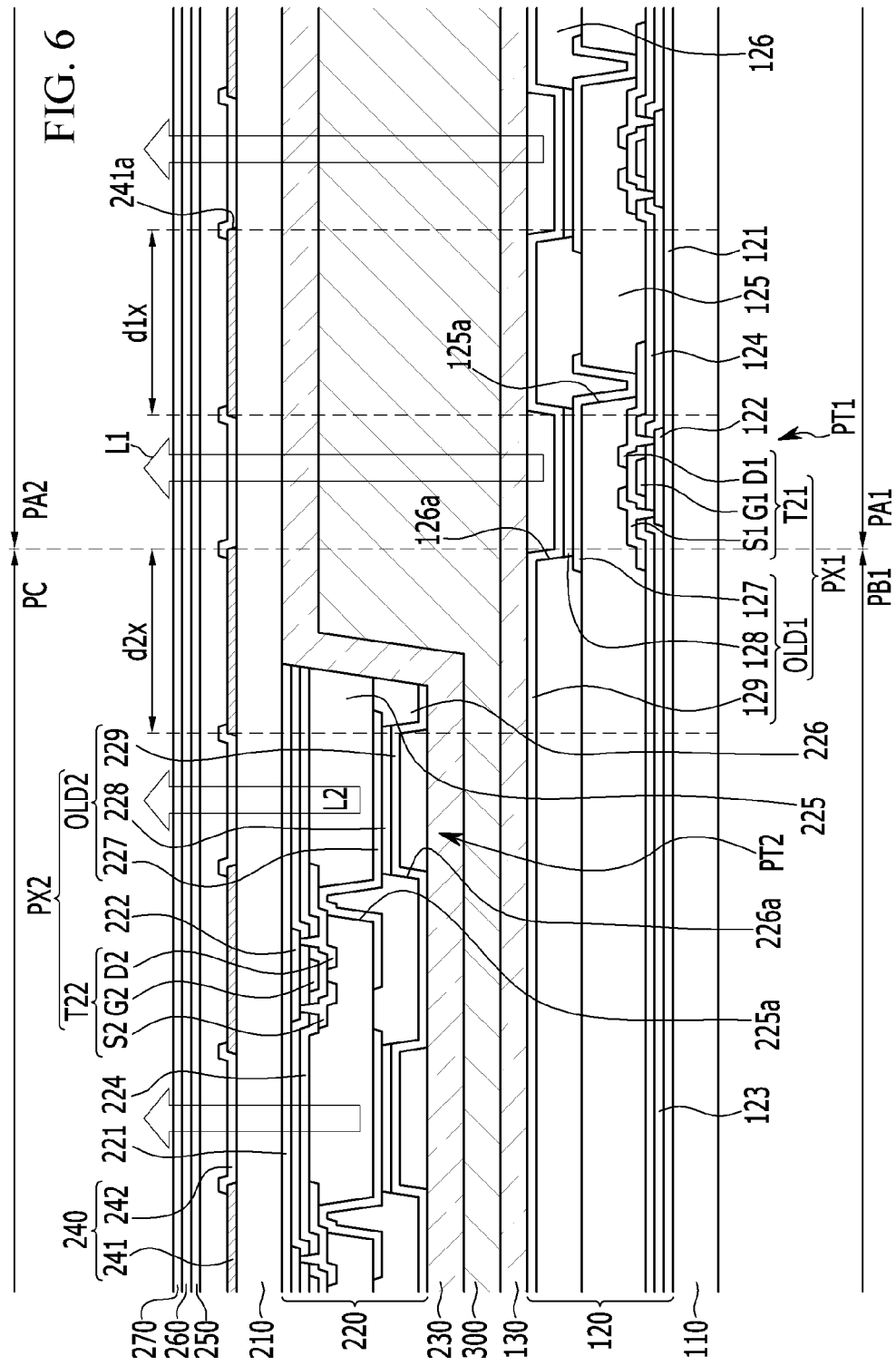
FIG. 6 is an enlarged top plan view of a portion B of FIG. 3.

FIG. 1 is a schematic top plan view of a display device according to an exemplary embodiment of the invention, FIG. 2 is a schematic cross-sectional view of a display device according to an exemplary embodiment of the invention, FIG. 3 is an enlarged cross-sectional view of one end portion of FIG. 2, FIG. 4 is an enlarged top plan view of a portion A of FIG. 1, FIG. 5 is an equivalent circuit diagram of one pixel of a display device according to an exemplary embodiment of the invention, and FIG. 6 is an enlarged top plan view of a portion B of FIG. 3.

First, as shown in FIGS. 1 and 2, a display device according to an exemplary embodiment of the invention includes a first substrate 110, a first emission layer 120 disposed on the first substrate 110, a first encapsulation layer 130 covering the first emission layer 120, a second substrate 210 facing the first substrate 110 and covering the first substrate 110, a second emission layer 220 disposed under the second substrate 210, a second encapsulation layer 230 covering the second emission layer 220 and the second substrate 210, an adhesive layer 300 interposed between the first encapsulation layer 130 and the second encapsulation layer 230 and adhering the first encapsulation layer 130 and the second encapsulation layer 230.

In an exemplary embodiment, the first substrate 110 may include a thin glass having a thickness of about 50 micrometers (μm) to about 100 μm, for example. In the case that the first substrate 110 includes a polymer such as PI to improve flexibility, when hardening the polymer, many impurities are generated such that there are a large number of process defects, and the surface charges are increased such that static electricity is generated, thereby requiring the management of foreign matter. However, when the first substrate 110 includes thin glass, the impurities and static electricity are not generated such that the additional management of foreign matter is not required. Also, when the first substrate 110 includes thin glass, the first substrate 110 is stronger than when including a polyimide such that the impact reliability is also high.

The first substrate 110 includes a first center portion PA1 and a first outer portion PB1 enclosing the first center portion PA1. This first substrate 110 may be a chemical tempered glass. Chemical tempered glass is a glass with a surface hardness that is enhanced by replacing a sodium factor as one basic component of the glass composition with a potassium factor to generate a compress stress in the surface of the glass.

As shown in FIG. 3, first emission layer 120 of the first substrate 110 is disposed in a position corresponding to the first center portion PA1 and first outer portion PB1. The first emission layer 120 includes a plurality of first pixels PX1 emitting light through a top surface. The plurality of first pixels PX1 is disposed at one position corresponding to the first center portion PA1.

The first encapsulation layer 130 is a thin film encapsulation layer in which an organic layer and an inorganic layer are alternately deposited and may be transparent.

The second substrate 210 has a larger area than the first substrate 110 and covers the entire first substrate 110. The second substrate 210 includes a second center portion PA2 overlapping the first center portion PA1 of the first substrate 110, a second outer portion PB2 that does not overlap the first substrate 110, and an overlapping portion PC overlapping the first outer portion PB1 of the first substrate 110.

In an exemplary embodiment, the second substrate 210 may include thin glass having a thickness of about 50 μm to about 100 μm, for example. In the case that the second substrate 210 includes a polymer such as PI to improve flexibility, when hardening the polymer, many impurities are generated such that there is a large number of process defects, and the surface charges are increased such that static electricity is generated, thereby requiring the management of foreign matter. However, when the first substrate 210 includes thin glass, the impurities and static electricity are not generated such that the additional management of foreign matter is not required. Also, when the second substrate 210 includes thin glass, the first substrate 110 is stronger than when including a polyimide, such that the impact reliability is also high.

The second substrate 210 may be chemical tempered glass including the potassium factor. Chemical tempered glass is thinner than general tempered glass and is equal to or greater than 1.7 times stronger, and there is no shrinkage or warping phenomena caused by the process.

The second emission layer 220 is disposed at a position corresponding to the second outer portion PB2 and the overlapping portion PC of the second substrate 210. The second emission layer 220 includes a plurality of second pixels PX2 emitting light to a rear surface through the second substrate 210. The plurality of second pixels PX2 is disposed at a position corresponding to the second outer portion PB2 and the overlapping portion PC.

The second encapsulation layer 230 covers the second emission layer 220 at the position corresponding to the second outer portion PB2 and the overlapping portion PC of the second substrate 210, but directly contacts the surface of the second center portion PA2 at the position corresponding to the second center portion PA2 of the second substrate 210. The second encapsulation layer 230 is a thin film encapsulation layer in which an organic layer and an inorganic layer are alternately deposited and may be transparent.

In an exemplary embodiment, the adhesive layer 300 as an optically clear adhesive ("OCA") functions like glass with equal to or greater than about 97 percent (%) light transmittance and simultaneously has adhesiveness, for example.

A light L1 generated from the first emission layer 120 is irradiated to the top surface and passes the second center portion PA2 of the second substrate 210, and a light L2 generated from the second emission layer 220 is irradiated to the rear surface and passes the second outer portion PB2 and the overlapping portion PC of the second substrate 210. Accordingly, the light passes through all of the second center portion PA2, the second outer portion PB2, and the overlapping portion PC of the second substrate 210 such that the non-light emitting region does not exist in the second substrate 210.

As described above, the second center portion PA2 of the second substrate 210 is used as a window of the top emission, and the second outer portion PB2 and the overlapping portion PC of the second substrate 210 are simultaneously used as the substrate of the bottom emission, thereby maximizing the emission region.

The overlapping portion PC of the second substrate 210 and the first outer portion PB1 of the first substrate 110 overlap each other. Accordingly, a portion of the first emission layer 120 and a portion of the second emission layer 220 overlap each other. In this case, the first pixel PX1 is not disposed in the first emission layer 120 of the position corresponding to the first outer portion PB1.

As shown in FIGS. 3 and 4, when an interval between the adjacent first pixels PX1 among the plurality of first pixels PX1 and the interval between the adjacent second pixel PX2 among the plurality of second pixels PX2 are referred to as a center portion interval $d1x$ and $d1y$, and the interval between the second outermost pixel PT2, which is the outermost positioned pixel among the plurality of second pixels PX2, and the first adjacent pixel PT1, which is closest to the second outermost pixel PT2 among the plurality of first pixels PX1 on the plane surface, is referred to as a boundary portion interval $d2x$ and $d2y$, the center portion interval $d1x$ and $d1y$ and the boundary portion interval $d2x$ and $d2y$ may be substantially the same.

In detail, a transverse boundary portion interval $d2x$ between the first adjacent pixel PT1 and the second outermost pixel PT2 closest thereto in the horizontal direction on the plane surface is substantially the same as a transverse center portion interval $d1x$ of a horizontal direction interval between the first pixels PX1 or the second pixels PX2. Also, a longitudinal boundary portion interval $d2y$ between the first adjacent pixel PT1 and the second outermost pixel PT2 closest thereto in the vertical direction on the plane surface is substantially the same as the center portion interval $d1y$ of the vertical direction interval between the first pixels PX1 or the second pixels PX2.

As described above, by forming the center portion intervals $d1x$ and $d1y$ between the first pixels PX1 or the second pixels PX2 and the boundary portion intervals $d2x$ and $d2y$ between the first pixel PX1 and the second pixel PX2 to be substantially the same as each other, the boundary portion between the first pixel PX1 and the second pixel PX2 positioned at different substrates is not recognized, and thereby the first emission layer 120 of the top emission and the second emission layer 220 of the bottom emission cannot be distinguished from each other. Accordingly, the display quality may be improved.

Also, by forming the luminance of the first pixel PX1 and the luminance of the second pixel PX2 to be the same as each other, the boundary portion between the first pixel PX1 and the second pixel PX2 is not recognized such that the display quality may be improved.

In addition, the first encapsulation layer 130 and the second encapsulation layer 230 are transparent such that the overlapping portion PC is not recognized even though the first substrate 110 and the second substrate 210 partially overlap, thereby improving the display quality.

Next, the detailed structure of the first emission layer 120 and the second emission layer 220 will be described with reference to FIGS. 5 and 6. In this case, the structure will be described regarding the driving transistor, since the switching transistor has substantially the same stack structure as that of the driving transistors, and thus a duplicate description thereof will be omitted.

FIG. 5 is an equivalent circuit diagram of one pixel of a display device according to an exemplary embodiment of the invention.

As shown in FIG. 5, a display device according to an exemplary embodiment of the invention includes a plurality of signal lines 21, 71, and 72, and a plurality of pixels PX connected to the plurality of signal lines and arranged in an approximate matrix type. The plurality of pixels PX includes a first pixel PX1 (refer to FIG. 6) in which the first emission layer 120 (refer to FIG. 6) is disposed and a second pixel PX2 in which the second emission layer 220 (refer to FIG. 6) is disposed.

The signal lines 21, 71, and 72 include a plurality of scan lines 21 transmitting a scan signal Sn, a plurality of data lines 71 crossing the scan lines 21 and transmitting a data signal Dm, and a plurality of driving voltage lines 72 transmitting a driving voltage ELVDD and which are substantially parallel to the data lines 71. The gate lines 21 extend substantially parallel to one another in a row direction, and the data lines 71 and the driving voltage lines 72 extend substantially parallel to one another in a column direction.

Each pixel PX includes a plurality of transistors T1 and T2 respectively connected to the plurality of signal lines 21, 71, and 72, a storage capacitor Cst, and an organic light emitting diode OLD.

The transistors T1 and T2 include a switching transistor T1 connected to the data line 71, and a driving transistor T2 connected to the organic light emitting diode OLD. The driving transistor T2 includes a first driving transistor T21 (refer to FIG. 6) in which the first emission layer 120 is disposed and a second driving transistor T22 (refer to FIG. 6) in which the second emission layer 220 is disposed.

The switching transistor T1 includes a control terminal, an input terminal, and an output terminal, and the control terminal thereof is connected to the scan line 21, the input terminal thereof is connected to the data line 71, and the output terminal thereof is connected to the driving transistor T2. The switching transistor T1 transmits the data signal Dm applied to the data line 71 to the driving transistor T2 in response to the scan signal Sn applied to the scan line 21.

The driving transistor T2 also includes a control terminal, an input terminal, and an output terminal, and the control terminal thereof is connected to the switching transistor T1, the input terminal thereof is connected to the driving voltage line 72, and the output terminal thereof is connected to the organic light emitting diode OLD. The driving transistor T2 allows a driving current Id, which has a level varying according to a voltage applied between the control terminal and the output terminal, to flow.

The storage capacitor Cst is connected between the control terminal and the input terminal of the driving transistor T2. The storage capacitor Cst charges the data signal applied to the control terminal of the driving transistor T2 and maintains the data signal even after the switching transistor T1 is turned off.

The organic light emitting diode OLD includes an anode that is connected to the output terminal of the driving transistor T2, and a cathode that is connected to the common voltage ELVSS. The organic light emitting diode OLD emits light with an intensity varying according to the driving current Id of the driving transistor T2, thereby displaying an image. The organic light emitting diode OLD includes a first organic light emitting diode OLD1 (refer to FIG. 6) in which the first emission layer 120 is disposed and a second organic light emitting diode OLD2 (refer to FIG. 6) in which the second emission layer 220 is disposed.

In an exemplary embodiment, the switching transistor T1 and the driving transistor T2 may be an n-channel field effect transistor ("FET") or a p-channel FET. In addition, a connection relationship among the transistors T1 and T2, the storage capacitor Cst, and the organic light emitting diode OLD may be changed.

FIG. 6 is an enlarged cross-sectional view of a portion of FIG. 3.

As shown in FIG. 6, a first buffer layer 121 is disposed on the first substrate 110. The first buffer layer 120 may serve to improve a characteristic of the polycrystalline silicon and reduce stress applied to the semiconductor 122 disposed on the buffer 121 by blocking impurities from the first substrate 110 and flattening the first substrate 110 during a crystallization process for forming polycrystalline silicon. In an exemplary embodiment, the first buffer layer 121 may include silicon nitride (SiNx) or silicon oxide (SiO2), for example.

A first semiconductor 122 is disposed on the first buffer layer 121. In an exemplary embodiment, the first semiconductor 122 may include polysilicon or an oxide semiconductor, for example.

A first gate insulating layer 123 covering the first semiconductor 122 is disposed thereon. In an exemplary embodiment, the first gate insulating layer 123 may include silicon nitride (SiNx) or silicon oxide (SiO2), or the like, for example.

A first gate electrode G1 is disposed on the first gate insulating layer 123. The first gate electrode G1 is a part of the scan line 21 and overlaps the first semiconductor 122.

A first interlayer insulating layer 124 covering the first gate electrode G1 is disposed thereon. In an exemplary embodiment, the first interlayer insulating layer 124 may include silicon nitride (SiNx) or silicon oxide (SiO2) like the first gate insulating layer 123, for example.

A first source electrode S1 and a first drain electrode D1 are disposed on the first interlayer insulating layer 124. The first source electrode S1 and the first drain electrode D1 are respectively connected to the source region and the drain region of the first semiconductor 122. The first gate electrode G1, the first source electrode S1, and the first drain electrode D1 provide a first driving transistor T21.

A first passivation layer 125 covering the first source electrode S1 and the first drain electrode D1 is disposed thereon.

In an exemplary embodiment, a first pixel electrode 127 including a reflective conductive material such as lithium (Li), calcium (Ca), lithium fluoride/calcium (LiF/Ca), lithium fluoride/aluminum (LiF/Al), aluminum (Al), silver (Ag), magnesium (Mg), or gold (Au) is disposed on the first passivation layer 125. The first pixel electrode 127 is electrically connected to the first drain electrode D1 of the first driving transistor T21 through the contact hole 125a defined in the passivation layer 125, thereby being an anode of the first organic light emitting diode OLD1.

A first partition 126 is disposed on the first passivation layer 125 and the edge of the first pixel electrode 127. The first partition 126 has a first pixel opening 126a exposing the first pixel electrode 127. In an exemplary embodiment, the first partition 126 may be provided to include a resin, such as polyacrylates or polyimides, and a silica-based inorganic material, or the like.

The first organic emission layer 128 is disposed in the first pixel opening 126a of the first partition 126. In an exemplary embodiment, the first organic emission layer 128 is disposed in multiple layers including one or more of a light emission layer, a hole injection layer ("HIL"), a hole transporting layer ("HTL"), an electron transporting layer ("ETL"), and an electron injection layer ("EIL"). When the first organic light emission layer 128 includes all of the light emission layer, the HIL, the HTL, the ETL, and the EIL, the HIL is positioned on the first pixel electrode 127, which is the anode, and the HTL, the light emission layer, the ETL, and the EIL are sequentially stacked on the HIL.

In an exemplary embodiment, a first common electrode 129 including a transparent conductive material such as indium tin oxide ("ITO"), indium zinc oxide ("IZO"), zinc oxide (ZnO), or indium oxide (In2O3) is disposed on the first partition 126 and the first organic emission layer 128. The first common electrode 129 becomes a cathode of the first organic light emitting diode OLD. The first pixel electrode 127, the first organic emission layer 128, and the first common electrode 129 together provide a first organic light emitting diode OLD1. The first organic light emitting diode OLD1 includes the first pixel electrode 127 including a reflection conductive material and the first common electrode 129 including the transparent conductive material such that the light L1 emitted from the first organic emission layer 128 is reflected on the first pixel electrode 127 and passes through the first common electrode 129. Accordingly, the light L1 emitted from the first organic emission layer 128 passes through the second center portion PA2 of the second substrate 210.

A second buffer layer 221 is disposed under the second substrate 210. A second semiconductor 222 is disposed on the second buffer layer 221. A second gate insulating layer 223 covering the second semiconductor 222 is disposed on the second semiconductor 222. A second gate electrode G2 is disposed on the second gate insulating layer 223. The first gate electrode G1 is part of the scan line 21 and partially overlaps the second semiconductor 222.

A second interlayer insulating layer 224 covering the second gate electrode G2 is disposed thereunder. A second source electrode S2 and a second drain electrode D2 are disposed under the second interlayer insulating layer 224. The second source electrode S2 and the second drain electrode D2 are respectively connected to the source region and the drain region of the second semiconductor 222. The second gate electrode G2, the second source electrode S2, and the second drain electrode D2 provide a second driving transistor T22.

A second passivation layer 225 covering the second source electrode S2 and the second drain electrode D2 is disposed thereunder.

A second pixel electrode 227 including the transparent conductive material is disposed under the second passivation layer 225. The second pixel electrode 227 is electrically connected to the second drain electrode D2 of the second driving transistor T22 through the contact hole 225a defined in the second passivation layer 225, thereby being the anode of the second organic light emitting diode OLD2.

A second partition 226 is disposed on the second passivation layer 225 and the edge of the second pixel electrode 227. The second partition 226 has a second pixel opening 226a exposing the first pixel electrode 127.

A second organic emission layer 228 is disposed in the second pixel opening 226a of the second partition 226. The second organic emission layer 228 is disposed in multiple layers including one or more of a light emission layer, an HIL, an HTL, an ETL, and an EIL. When second organic emission layer 228 includes all of the light emission layer, the HIL, the HTL, the ETL, and the EIL, the HIL is positioned on the second pixel electrode 227, which is the anode, and the HTL, the light emission layer, the ETL, and the EIL are sequentially stacked on the HIL.

A second common electrode 229 including the reflective conductive material is disposed under the second partition 226 and the second organic emission layer 228. The second common electrode 229 becomes the cathode of the second organic light emitting diode OLD2. The second pixel electrode 227, the second organic emission layer 228, and the second common electrode 229 together provide the second organic light emitting diode OLD2. Since the second organic light emitting diode OLD2 includes a second pixel electrode 227 including the transparent conductive material and a second common electrode 229 including the reflective conductive material, the light L2 emitted from the second organic emission layer 228 passes through the second pixel electrode 227 and is reflected by the second common electrode 229. Accordingly, the light L2 emitted from the second organic emission layer 228 passes through the second outer portion PB2 and the overlapping portion PC of the second substrate 210.

The first pixel PX1 including the first driving transistor T21 and the first organic light emitting diode OLD1 is only provided at the position corresponding to the first center portion PA1 of the first substrate 110, but is not provided at the position corresponding to the first outer portion PB1 of the first substrate 110. Also, the second pixel PX2 including the second driving transistor T22 and the second organic light emitting diode OLD2 is provided at the position corresponding to the overlapping portion PC and the second outer portion PB2 (refer to FIGS. 1 to 3) of the second substrate 210.

Also, the transverse boundary portion interval d2x between the first adjacent pixel PT1 (refer to FIG. 4) and the second outermost pixel PT2 (refer to FIG. 4) closest thereto in the horizontal direction on the plane surface is substantially the same as the transverse center portion interval d1x of the horizontal direction interval between the first pixels PX1. As described above, by forming the center portion interval d1x between the first pixels PX1 and the boundary portion interval d2x between the first pixel PX1 and the second pixel PX2 to be substantially the same, the boundary portion between the first pixel PX1 and the second pixel PX2 is not recognized such that the first emission layer 120 of the top emission and the second emission layer 220 of the bottom emission may not be distinguished from each other. Accordingly, the display quality may be improved.

An adhesive layer 300 is disposed between the first encapsulation layer 130 and the second encapsulation layer 230. In this case, the second encapsulation layer 230 covering the end of the second emission layer 220 covers the inclined side wall of the second emission layer 220, and the second encapsulation layer 230 contacts the surface of the second substrate 210.

Also, a polarization layer 240 to remove the reflection of the external light is disposed on the second substrate 210. The polarization layer 240 is disposed on the second substrate 210 and includes a light blocking member 241 blocking the light and a color filter 242 is disposed in a plurality of light blocking openings 241a of the light blocking member 241. In an exemplary embodiment, the light blocking member 241 may include a metal such as chromium (Cr) or an organic material, and the color filter 242 may overlap a portion of the light blocking member 241.

A first hard coating layer 250 is disposed on the polarization layer 240. In an exemplary embodiment, the first hard coating layer 250 includes a siloxane-based compound, the siloxane-based compound includes any one of poly ether modified poly dimethyl siloxane or poly dimethyl siloxane of a poly ether modified hydroxyl functional group, or a combination of two or more thereof, that is, examples of the siloxane-based compound include BYK-306 (BYK chemi agent), BYK-307, BYK-308, BYK-310, BYK-330, BYK-333, BYK-341, and BYK-344.

A touch sensor 260 is disposed on the first hard coating layer 250. The touch sensor 260 adhered under the second substrate 210 as an input device of the display device inputs the information through a screen being directly contacted by a finger or a pen. The touch sensor 260 may be a capacitive type sensing a position where a capacitance change is generated according to the contact on two electrodes separated from each other.

A second hard coating layer 270 is disposed on the touch sensor 260. In an exemplary embodiment, the second hard coating layer 270 includes a siloxane-based compound, the siloxane-based compound may include any one among poly ether modified poly dimethyl siloxane or a poly dimethyl siloxane of poly ether modified hydroxyl functional group, or a combination of two or more thereof, that is, examples of the siloxane-based compound include BYK-306 (BYK chemi agent), BYK-307, BYK-308, BYK-310, BYK-330, BYK-333, BYK-341, and BYK-344.

As described above, by forming the first hard coating layer 250 and the second hard coating layer 270, the hardness of the second substrate 210 as the glass substrate having a thin thickness of about 50 μm to about 100 μm, for example, may be improved. In this case, the second hard coating layer 270 may be omitted.

A manufacturing method of the display device according to an exemplary embodiment of the invention will be described with reference to the accompanying drawings.

Figure 7:
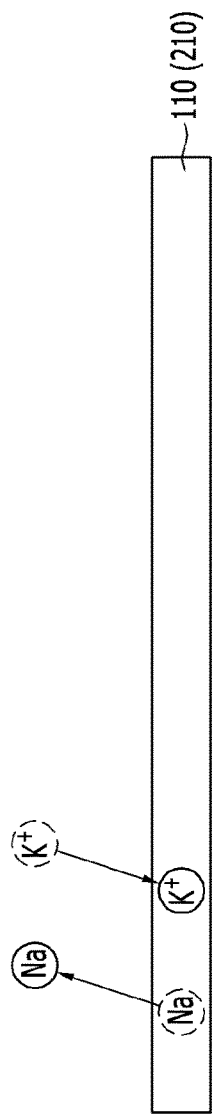
FIGS. 7, 8 and 9 are cross-sectional views sequentially showing a manufacturing method of a display device according to an exemplary embodiment of the invention.
Figure 8:
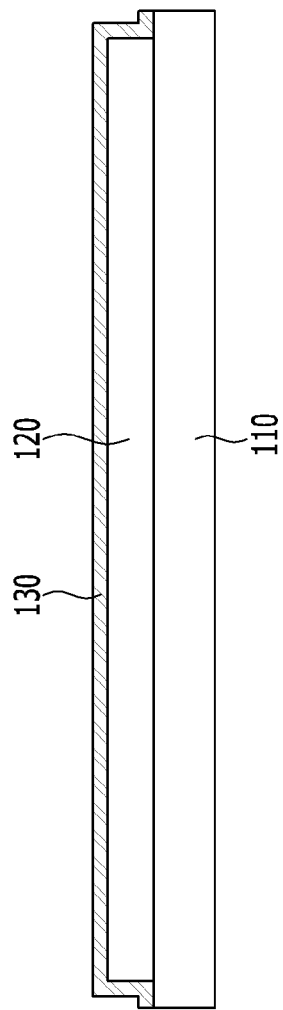
Figure 9:
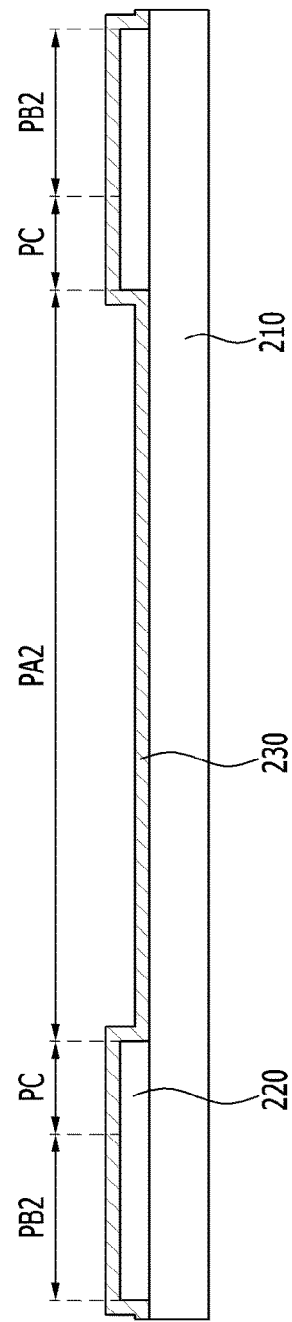

FIGS. 7, 8, and 9 are cross-sectional views sequentially showing a manufacturing method of a display device according to an exemplary embodiment of the invention.

First, as shown in FIG. 7, the first substrate 110 and the second substrate 210 are chemically enhanced by replacing a sodium factor with a potassium factor in the first substrate 110 and second substrate 210. In an exemplary embodiment, as the chemical enhancing method, a slurry process using an ion exchange slurry, a dipping process enabling the reuse of a potassium nitrate salt, or a deposition process reducing a material and simplifying the process without a oxide-based additive or a distilled water is used, for example.

In an exemplary embodiment, the first substrate 110 and the second substrate 210 include a glass, and the surface hardness thereof is enhanced by replacing a sodium factor as one of basic components of a glass composition with a potassium factor to generate a compress stress in the surface of the glass. Accordingly, by manufacturing the first substrate 110 and the second substrate 220 including thin glass having a thickness of about 50 μm to about 100 μm, for example, the flexibility may be improved and the hardness may be improved.

Next, as shown in FIG. 8, the first emission layer 120 of the top emission type is disposed on the first substrate 110. Also, the first encapsulation layer 130 covering the first emission layer 120 is provided.

Next, as shown in FIG. 9, the second emission layer 220 of the bottom emission type through the second substrate 210 is disposed on the second outer portion PB2 and the overlapping portion PC of the second substrate 210. Also, the second encapsulation layer 230 covering the second emission layer 220 is provided.

Next, as shown in FIG. 2, the second substrate 210 is turned and the adhesive layer 300 is interposed between the first encapsulation layer 130 and the second encapsulation layer 230 to adhere the first encapsulation layer 130 and the second encapsulation layer 230.

In this case, the portion of the first emission layer 120 and the portion of the second emission layer 220 overlap each other. In this case, since the second emission layer 220 is not positioned in the second center portion PA2 of the second substrate 210, the thickness t1 of the adhesive layer 300 positioned in the second center portion PA2 of the second substrate 210 may be larger than the thickness t2 of the adhesive layer positioned in the second outer portion PB2 and the overlapping portion PC of the second substrate 210.

Also, by forming the center portion intervals $d1x$ (refer to FIG. 4) and $d1y$ (refer to FIG. 4) between the first pixels PX1 or the second pixels PX2 and the boundary portion intervals $d2x$ (refer to FIG. 4) and $d2y$ (refer to FIG. 4) between the first pixel PX1 and the second pixel PX2 to be substantially the same, the boundary portion between the first pixel PX1 and the second pixel PX2 positioned in the different substrates is not recognized such that the first emission layer 120 of the top emission and the second emission layer 220 of the bottom emission may not be distinguished from each other.

Also, on the second substrate 210, the polarization layer 240, the first hard coating layer 250, the touch sensor 260, and the second hard coating layer 270 are sequentially provided. As described above, by forming the first hard coating layer 250 and the second hard coating layer 270, the hardness of the second substrate 210 as a thin glass substrate having a thickness of about 50 μm to about 100 μm may be improved, for example.

In the exemplary embodiment, the first pixel may not be disposed in the first emission layer of the position corresponding to the first outer portion, and the first pixel may be disposed in the first emission layer of the position corresponding to the first outer portion in another exemplary embodiment.

Next, the display device according to another exemplary embodiment of the invention will be described with reference to FIGS. 10 and 11.

Figure 10:
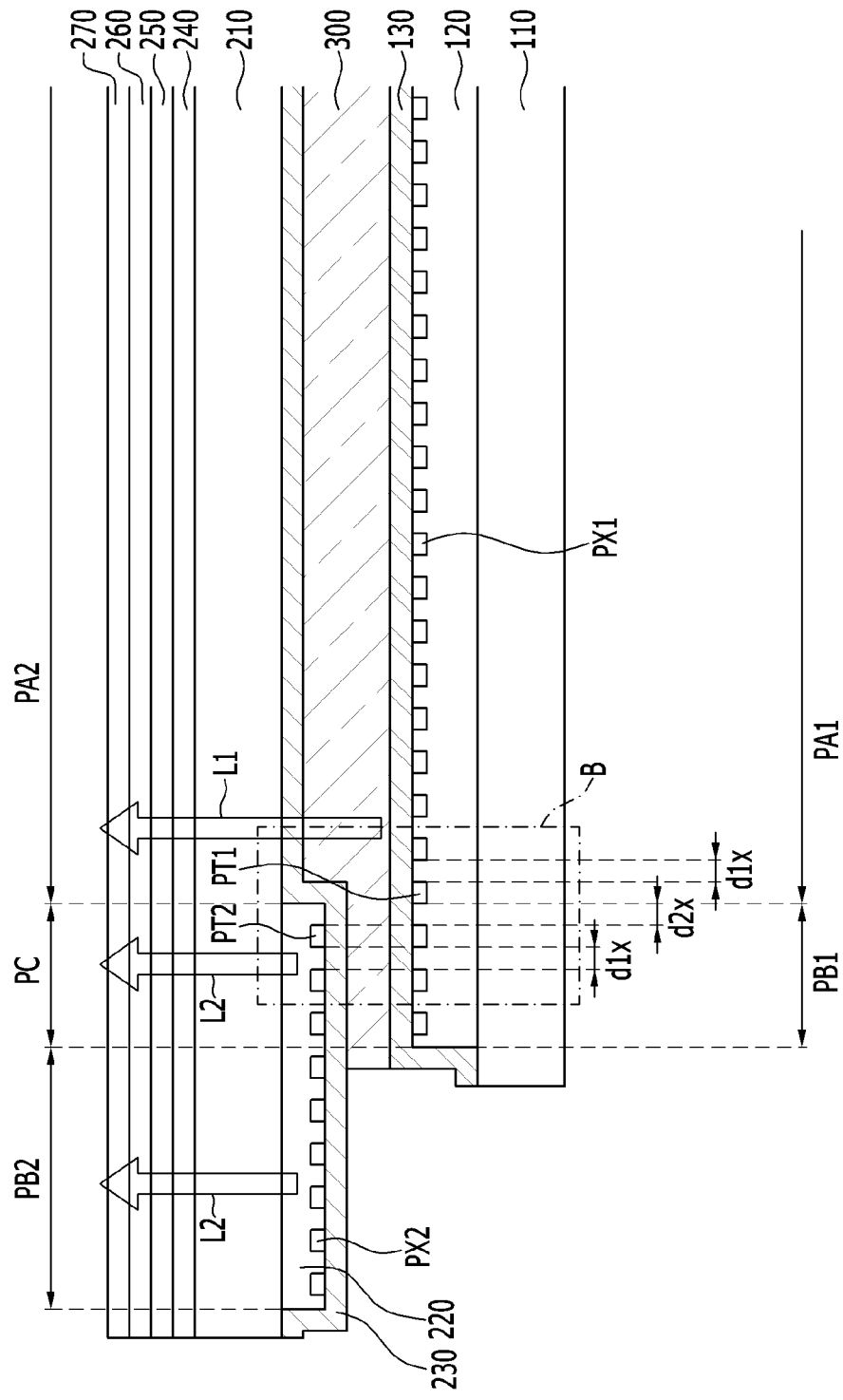
FIG. 10 is a detailed cross-sectional view of a display device according to another exemplary embodiment of the invention.
Figure 11:
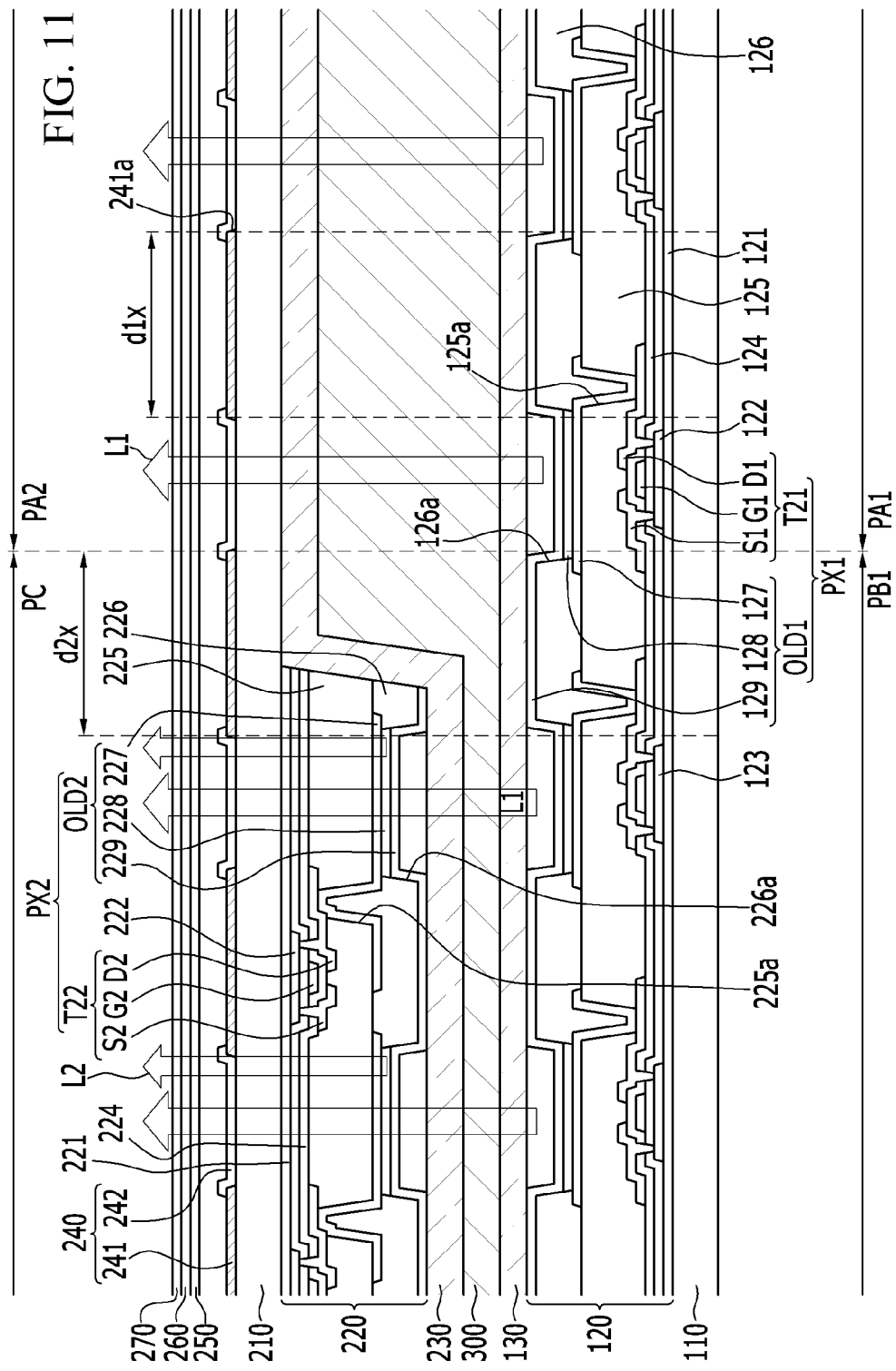
FIG. 11 is an enlarged top plan view of a portion B of FIG. 10.

FIG. 10 is a detailed cross-sectional view of a display device according to another exemplary embodiment of the invention, and FIG. 11 is an enlarged top plan view of a portion B of FIG. 10.

Another exemplary embodiment shown in FIGS. 10 and 11 is substantially the same as the exemplary embodiment shown in FIGS. 1 to 7, except for the first pixel disposed in the first emission layer of the position corresponding to the first outer portion, such that a duplicate description is omitted.

As shown in FIGS. 10 and 11, in the display device according to another exemplary embodiment of the invention, the first pixel PX1 including the first driving transistor T21 and the first organic light emitting diode OLD1 is entirely provided at the position corresponding to the first center portion PA1 and the first outer portion PB1 of the first substrate 110. Also, the second pixel PX2 including the second driving transistor T22 and the second organic light emitting diode OLD2 is provided at the position corresponding to the overlapping portion PC and the second outer portion PB2 of the second substrate 210.

In this case, the first organic light emitting diode OLD1 of the first pixel PX1 provided at the position corresponding to the first outer portion PB1 includes the first pixel electrode 127 including the reflective conductive material and the first common electrode 129 including the transparent conductive material such that the light L1 emitted from the first organic emission layer 128 is reflected by the first pixel electrode 127 and passes through the first common electrode 129.

Accordingly, the light L1 emitted from the first organic emission layer 128 passes through the adhesive layer 300.

Also, the second pixel electrode 227 including the transparent conductive material is disposed under the second passivation layer 225. The second organic emission layer 228 is disposed in the second pixel opening 226a of the second partition 226. The second common electrode 229 including the transflective material is disposed under the second partition 226 and the second organic emission layer 228. The second pixel electrode 227, the second organic emission layer 228, and the second common electrode 229 together provide the second organic light emitting diode OLD2.

As described above, the second organic light emitting diode OLD2 of the second pixel PX2 provided at the position corresponding to the overlapping portion PC of the second substrate 210 includes the second pixel electrode 227 including the transparent conductive material and the second common electrode 229 including the transflective material such that the light L2 emitted from the second organic emission layer 228 passes through the second pixel electrode 227 and reflects the second common electrode 229. Accordingly, the light L2 emitted from the second organic emission layer 228 passes through the second outer portion PB2 (refer to FIG. 10) and the overlapping portion PC of the second substrate 210.

Also, since the second common electrode 229 of the second pixel PX2 provided at the position corresponding to the overlapping portion PC of the second substrate 210 includes the transflective material, the light L1 emitted from the first organic emission layer 128 and passing through the adhesive layer 300 also passes through the overlapping portion PC of the second substrate 210.

In the overlapping portion PC of the second substrate 210, the light L1 emitted from the first organic emission layer 128 and the light L2 emitted from the second organic emission layer 228 are combined to realize various colors.

Also, in the exemplary embodiment, the first organic light emitting diode is disposed on the first substrate 110, however it is not limited thereto and a liquid crystal display may be disposed on the first substrate 110 to realize the invention.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a first substrate;
a first emission layer disposed on the first substrate and emitted by a top emission type;
a second substrate facing the first substrate, completely covering the first substrate, and being wider than the first substrate; and
a second emission layer disposed under the second substrate and emitted by a bottom emission type,
wherein a portion of the first emission layer and a portion of the second emission layer overlap each other,
the first substrate includes a first center portion and a first outer portion enclosing the first center portion,
the second substrate includes a second center portion, an overlapping portion enclosing the second center portion, and a second outer portion enclosing the overlapping portion,
the first emission layer includes all light emission materials disposed on the first substrate, a plurality of organic light emitting diodes spaced apart from each other and a plurality of organic emission layers spaced apart from each other on the first center portion,
the second emission layer is disposed only under the second outer portion and the overlapping portion and includes all light emission materials disposed on the second substrate, and
the second outer portion overlaps neither the first center portion nor the first outer portion.

2. The display device of claim 1, wherein:
the first substrate and second substrate respectively include thin glasses having a thickness of about 50 micrometers to about 100 micrometers.

3. The display device of claim 1, wherein:
the first substrate and the second substrate are respectively chemical tempered glasses including a potassium factor.

4. The display device of claim 1, wherein:
the overlapping portion and the first outer portion overlap each other.

5. The display device of claim 4, wherein:
the portion of the first emission layer positioned at the first outer portion and the portion of the second emission layer positioned at the overlapping portion overlap each other.

6. The display device of claim 1, further comprising:
a first encapsulation layer covering the first emission layer;
a second encapsulation layer covering the second emission layer and the second substrate; and
an adhesive layer adhering the first encapsulation layer and the second encapsulation layer to each other.

7. The display device of claim 6, wherein:
the second center portion of the second substrate contacts the second encapsulation layer.

8. The display device of claim 6, wherein:
a thickness of the adhesive layer positioned in the second center portion of the second substrate is larger than a thickness of the adhesive layer positioned in the second outer portion and the overlapping portion of the second substrate.

9. The display device of claim 1, wherein:
the first emission layer includes a plurality of first pixels, and the second emission layer includes a plurality of second pixels, and
a boundary portion interval serving as an interval between a second outermost pixel, which is an outermost positioned pixel among the plurality of second pixels, and a first pixel, which is closest to the second outermost pixel among the plurality of first pixels on a plane surface, is substantially the same as the center portion interval serving as the interval between adjacent first pixels among the plurality of first pixels.

10. The display device of claim 9, wherein:
the first pixel is only positioned in the first center portion.

11. The display device of claim 9, wherein:
the first pixel is positioned at the first center portion and the first outer portion.

12. The display device of claim 9, wherein:
the first pixel includes:
a first driving transistor disposed on the first substrate, and
a first organic light emitting diode connected to the first driving transistor;
the second pixel includes a second driving transistor disposed on the second substrate, and a second organic light emitting diode connected to the second driving transistor; and light emitted from the first organic light emitting diode and the second organic light emitting diode passes through the second substrate to be irradiated.

13. The display device of claim 12, further comprising:

a polarizer disposed on the second substrate.

14. The display device of claim 13, wherein:

the polarizer includes:

a light blocking member which is disposed on the second substrate and in which a plurality of light blocking openings is defined, and a color filter disposed in the plurality of light blocking openings.

15. The display device of claim 13, further comprising:

a first hard coating layer disposed on the polarizer.

16. The display device of claim 15, further comprising:

a touch sensor disposed on the first hard coating layer.

17. The display device of claim 16, wherein:

a second hard coating layer is disposed on the touch sensor.

* * * * *